(12) United States Patent
Hayashi (10) Patent No.: US 10,461,448 B2
(45) Date of Patent: Oct. 29, 2019

(54) BOARD MOUNTING TERMINAL (71) Applicant: Tyco Electronics Japan G.K., Kanagawa (JP)

(72) Inventor: Toshiaki Hayashi, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 0 days.

(21) Appl. No.: 16/127,559

(22) Filed: Sep. 11, 2018

(65) Prior Publication Data

US 2019/0089076 A1 Mar. 21, 2019

(30) Foreign Application Priority Data

Sep. 15, 2017 (JP) ................. 2017-178050

(51) Int. Cl.
*H01R 12/58* (2011.01)
*H01R 4/02* (2006.01)
*H05K 3/34* (2006.01)
*H05K 1/18* (2006.01)

(52) U.S. Cl.
CPC ............. *H01R 12/58* (2013.01); *H01R 4/02* (2013.01); *H01R 4/024* (2013.01); *H05K 3/3447* (2013.01); *H05K 1/184* (2013.01)

(58) Field of Classification Search
CPC .......... H01R 4/02; H01R 12/58; H01R 13/04; H01R 43/16; H01R 43/205; H05K 1/11; Y10T 29/49149
USPC ...................................................... 174/126.1
See application file for complete search history.

(56) References Cited

U.S. PATENT DOCUMENTS

| 3,420,087 | A | * | 1/1969 | Hatfield | ................... | H01R 4/14 |
| | | | | | | 29/874 |
| 4,186,982 | A | * | 2/1980 | Cobaugh | ................ | H01R 12/58 |
| | | | | | | 439/444 |
| 4,526,429 | A | * | 7/1985 | Kirkman | ................ | H01R 12/58 |
| | | | | | | 439/751 |
| 4,585,293 | A | * | 4/1986 | Czeschka | ............... | H01R 12/58 |
| | | | | | | 439/751 |
| 4,646,204 | A | * | 2/1987 | Brauer | ................... | H05K 3/308 |
| | | | | | | 361/767 |
| 4,793,817 | A | * | 12/1988 | Hiesbock | ............. | H01R 12/585 |
| | | | | | | 439/751 |

(Continued)

FOREIGN PATENT DOCUMENTS

| JP | 2011-54528 A | 3/2011 |
| JP | 2015-504586 A | 2/2015 |

OTHER PUBLICATIONS

Abstract of JP2011054528, dated Mar. 17, 2011, 1 page.

*Primary Examiner* — Andargie M Aychillhum
*Assistant Examiner* — Michael F McAllister
(74) *Attorney, Agent, or Firm* — Barley Snyder (57) ABSTRACT

A board mounting terminal of a type inserted into a through-hole of a circuit board and capable of being reliably reflow-soldered. The board mounting terminal has a recessed groove extending in a direction of extension of the board mounting terminal. This recessed groove has an area of a recess of the recessed groove in a cross-section extending in a direction transverse to the direction of extension of the board mounting terminal that decreases as the distance from a tip portion of the board mounting terminal, oriented in a direction of insertion of the board mounting terminal, increases.

15 Claims, 9 Drawing Sheets

(56) References Cited

U.S. PATENT DOCUMENTS

| | | | | |
|---|---|---|---|---|
| 4,831,728 | A * | 5/1989 | Barnhouse | H01R 12/585 29/874 |
| 4,907,988 | A * | 3/1990 | Tilse | H01R 12/58 439/751 |
| 4,908,942 | A * | 3/1990 | Long | H01R 43/16 29/882 |
| 5,374,204 | A * | 12/1994 | Foley | H01R 12/585 439/751 |
| 5,589,669 | A * | 12/1996 | Downes | H01R 12/58 174/250 |
| 5,667,412 | A * | 9/1997 | Takahashi | H01R 12/585 439/751 |
| 5,893,779 | A * | 4/1999 | Bianca | H01R 12/585 439/751 |
| 5,942,906 | A * | 8/1999 | Stowers | H01R 13/2421 324/750.25 |
| 5,944,563 | A * | 8/1999 | Nagafuji | H01R 12/585 439/751 |
| 7,320,627 | B2 * | 1/2008 | Skarlupka | H01R 4/10 439/751 |
| 7,377,823 | B2 * | 5/2008 | Chen | H01R 12/585 439/751 |
| 7,438,593 | B2 * | 10/2008 | Blakborn | H05K 3/3447 174/262 |
| 8,888,541 | B2 * | 11/2014 | Endo | H01R 12/585 439/751 |
| 9,431,719 | B2 * | 8/2016 | Braunger | H01R 12/58 |

\* cited by examiner

BOARD MOUNTING TERMINAL

CROSS-REFERENCE TO RELATED APPLICATION

This application claims the benefit of the filing date of 35 U.S.C. § 119(a)-(d) of Japanese Patent Application No. 2017-178050 filed on Sep. 15, 2017.

FIELD OF THE INVENTION

The present invention relates to a board mounting terminal of a type extending like a rod for being inserted into a through-hole provided in a circuit board and soldered to the circuit board.

BACKGROUND

Reflow soldering is widely performed in which a paste-like solder is applied or printed in advance to a necessary location on a circuit board and thereafter the solder is heated. In this reflow soldering, electronic devices or the like are positioned at the locations of the circuit board having the solder paste applied or printed thereto and are heated in a reflow oven. Thereby, these electronic devices or the like are soldered to the circuit board.

In this regard, a thought is given to reflow soldering in which a through-hole of a circuit board is filled with a solder paste in advance and a rod-like terminal is inserted thereinto. In this case, a part of the solder paste within the through-hole is pushed out by inserting the terminal into the through-hole. Therefore, without a countermeasure taken in advance, the solder paste having been pushed out and adhering to the tip of the terminal tends to melt and drip when being heated in the reflow oven. When the solder drips, an insufficiency of solder for soldering occurs, which may result in a soldering defect.

JP2011-54528A suggests forming a tip portion of the terminal into a shape dissimilar from an inner-peripheral shape of the through-hole by a pressing process. In addition, this PLT1 further suggests forming in the tip portion of the terminal a recessed groove extending in a direction of insertion into the through-hole. JP2011-54528A makes a statement to the effect that the recessed groove actively brings a capillary action about to improve solder wicking along the recessed groove.

The recessed groove disclosed in JP2011-54528A is a groove having a constant cross-section in the longitudinal direction or having a cross-section enlarging as the distance from the tip increases. Therefore, the capillary action is not sufficiently brought about and not all the solder melted can be prevented from dripping, so that the possibility still remains that the insufficiency of solder for soldering may occur.

SUMMARY

A board mounting terminal, constructed in accordance with the present invention, extends like a rod and is adapted for insertion into a through-hole in a circuit board and soldered to the circuit board. This board mounting terminal has a tip portion and a recessed groove. The recessed groove extends in a direction of extension of the board mounting terminal and has a tip end in the tip portion of the board mounting terminal. The area of a recess of the recessed groove in cross-section, extending in a direction transverse to the direction of extension of the board mounting terminal, decreases as a distance from the tip portion of the board mounting terminal, oriented in a direction of insertion of the board mounting terminal, increases.

Capillary action is a phenomenon of liquid penetration into a narrower space. With the board mounting terminal of the present invention, the capillary action is forcefully brought about, so that reliable soldering without an insufficiency of solder is achieved.

DETAILED DESCRIPTION OF THE EMBODIMENT(S)

Figure 1:
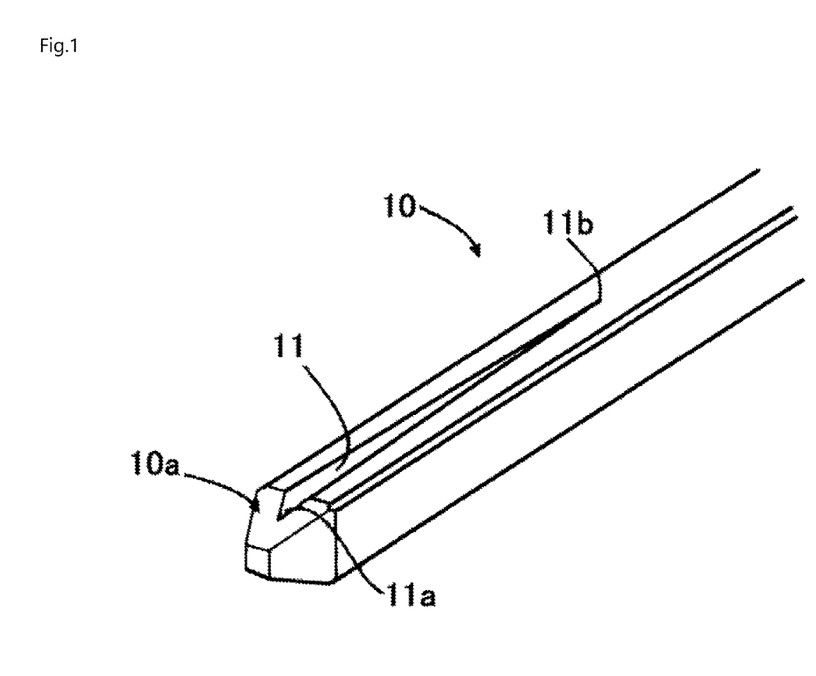
FIG. 1 is an isometric view showing a tip portion of a board mounting terminal as an embodiment of the present invention.
Figure 2:
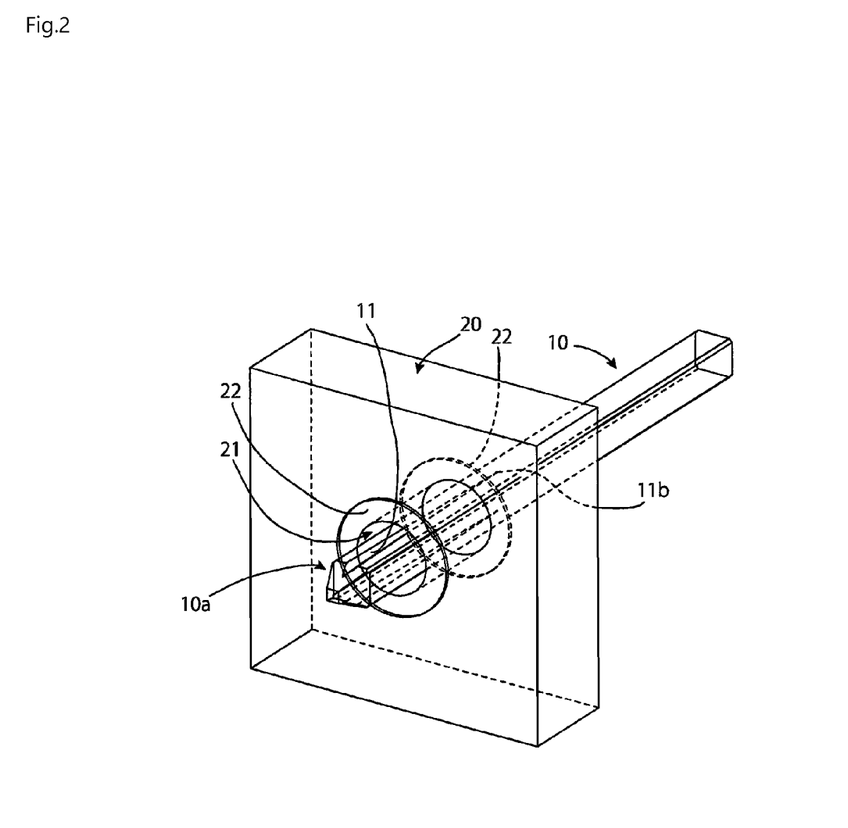
FIG. 2 is an isometric view showing the board mounting terminal of the present embodiment when having been inserted into a through-hole of a circuit board.

FIG. 1 is an isometric view showing a tip portion of a board mounting terminal as an embodiment of the present invention. This board mounting terminal 10 extends like a rod. As shown in FIG. 2, the board mounting terminal 10 is inserted into a through-hole 21 in a circuit board 20 and soldered to the circuit board 20.

This board mounting terminal 10 has a recessed groove 11. This recessed groove 11 has a tip end 11a in a tip portion 10a of the board mounting terminal 10 oriented in a direction of insertion and extends to a rear end 11b in a direction of extension of the board mounting terminal 10. The board mounting terminal 10 of the present embodiment has a substantially rectangular shape in a cross-section extending in a direction transverse to the direction of extension of the board mounting terminal 10. The board mounting terminal 10 of the present embodiment has two recessed grooves 11 formed in opposite faces of the board mounting terminal 10 by a stamping process. Each recessed groove 11 has a shape decreasing continuously the area of a recess of the recessed groove in the cross-section as the distance from the tip portion 10a of the board mounting terminal increases. Details of the shape of the recessed grooves 11 will be described hereinafter.

FIG. 2 is an isometric view of the board mounting terminal of the present embodiment when being inserted into the through-hole of a circuit board. This board mounting terminal 10 is inserted into the through-hole 21 of the circuit board 20 with the tip portion 10a of the board mounting terminal oriented forward. An inner wall face of this through-hole 21 is plated with metal. In addition, lands 22 made of metal films extend around the through-hole 21 on both top and bottom faces of the circuit board 20. The board mounting terminal 10 is inserted into the through-hole 21 of the circuit board 20, as shown in FIG. 2, and is soldered to the plating of the inner wall face of the through-hole 21 and to the lands 22 on both the top and bottom faces of the circuit board 20 by reflow soldering. This soldering results in formation of solder fillets (not shown) around the board mounting terminal 10 on both the top and bottom faces of the circuit board 20.

In this regard, the recessed groove 11 formed in this board mounting terminal 10 extends longer than a thickness of the circuit board 20. Moreover, at the time of soldering, regarding a side distant from the tip portion 10a, the solder fillet is so formed as to cover the recessed groove 11 to the rear end 11b. That is, this recessed groove 11 not only functions to bring about the capillary action but can also be used as an indicator of whether or not the soldering is successful by observing whether or not the solder fillet covers the rear end 11b.

Figures 3A, 3B, 3Y:
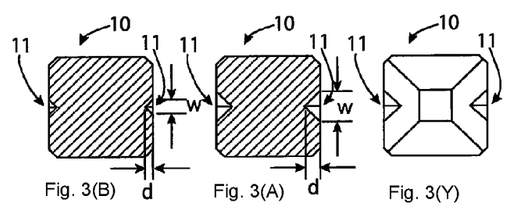
FIGS. 3(X), 3(Y), 3(A), 3(B), and 3(C) are views showing the board mounting terminal of the present embodiment.
Figure 3C:
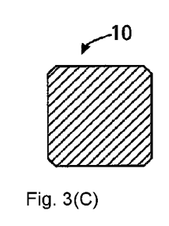
Figure 3X:
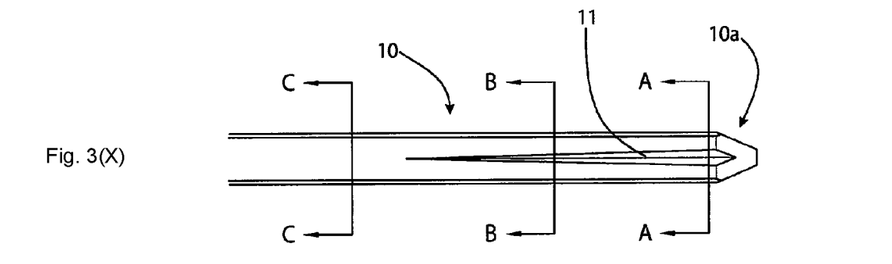

FIGS. 3(X), 3(Y), 3(A), 3(B), and 3(C) are views showing the board mounting terminal of the present embodiment. In this regard, FIG. 3(X) is a top view, FIG. 3(Y) is a side view from the right side of the FIG. 3(X), and FIGS. 3(A), 3(B), and 3(C) are cross-sectional views taken along arrows A-A, B-B, and C-C, respectively, in FIG. 3(X). The side view of FIG. 3(Y) and the respective cross-sectional views of FIGS. 3(A) to 3(C) are views scaled up from the top view of FIG. 3(X).

As shown in FIGS. 3(X), 3(Y), 3(A), 3(B), and 3(C), the recessed groove 11 of the board mounting terminal 10 of the present embodiment is a groove having a shape decreasing a width of the recessed groove 11 and a depth of the recessed groove 11 appearing in the cross-section continuously as the distance from the tip portion 10a increases. More specifically, the recessed groove 11 of the board mounting terminal 10 of the present embodiment shown here has a triangular recess in cross-section. Moreover, the recessed groove 11 has a shape decreasing both a length of a base of the triangle (groove width) and a height of the triangle (groove depth) continuously as the distance from the tip portion 10a of the board mounting terminal increases.

Since the board mounting terminal 10 of the present embodiment has the area of the recess of the recessed groove 11 in the cross-section continuously decreasing in this manner, the capillary action is forcefully brought about at the time of reflow soldering described hereinafter. The board mounting terminal 10 of the present embodiment utilizes this capillary action to achieve reliable soldering without an insufficiency of solder.

In order to describe the effect of the capillary action of recessed groove 11, a board mounting terminal 10 not having the recessed groove 11 will be described as a comparative example.

Figure 4A:
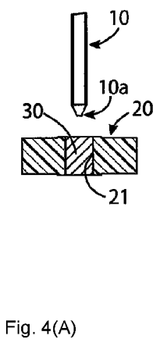
FIGS. 4(A) to 4(E) are schematic views showing a phenomenon occurring at the time of soldering of a board mounting terminal not having a recessed groove.
Figure 4B:
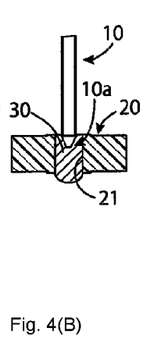
Figure 4C:
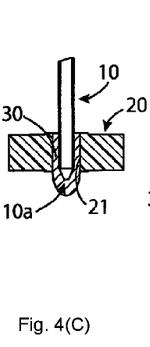
Figure 4D:
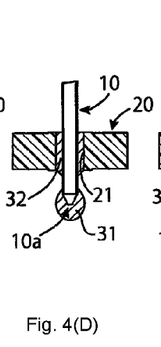
Figure 4E:
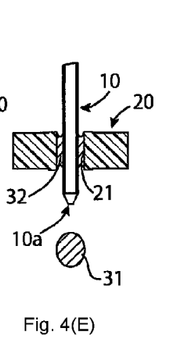

FIGS. 4(A) to 4(E) are schematic views showing a phenomenon occurring at the time of soldering of the board mounting terminal not having the recessed groove. The through-hole 21 of the circuit board 20 is filled with a solder paste 30 in advance. Then, in sequence from FIG. 4(A) to FIG. 4(D), the board mounting terminal 10 is inserted into the through-hole 21, with the tip portion 10a of the board mounting terminal 10 oriented forward. Thereupon, a partial solder paste 31 of the solder paste 30 within the through-hole 21 is pushed out and adheres to the tip portion 10a of the board mounting terminal 10, as shown in FIG. 4(D). In this state, the circuit board 20 is put into a reflow oven (not shown) and heated. Thereupon, the solder pastes 31, 32 melt and their viscosities lower, which may result in dripping of the solder paste 31 adhering to the tip portion 10a of the board mounting terminal 10. When this dripping occurs, a solder 32 within the through-hole 21 becomes insufficient, which may result in a soldering defect.

FIGS. 5(A) to 5(E) are schematic views showing a phenomenon occurring at the time of soldering of the board mounting terminal of the present embodiment. The showings of board mounting terminal 10 of the present embodiment in FIGS. 5(A) to 5(D) are identical to the showings of board mounting terminal 10 in FIGS. 4(A) to 4(D), respectively.

Figure 5A:
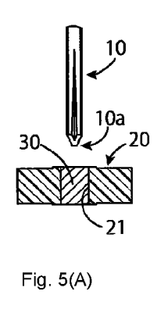
FIGS. 5(A) to 5(E) are schematic views showing a phenomenon occurring at the time of soldering of the board mounting terminal of the present embodiment.
Figure 5B:
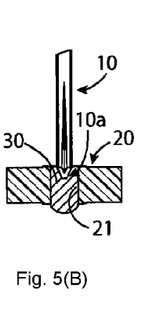
Figure 5C:
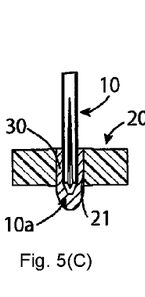
Figure 5D:
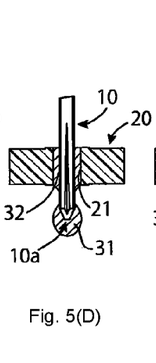
Figure 5E:
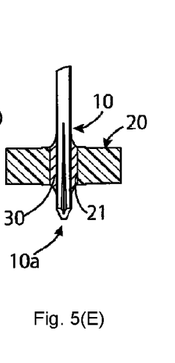
Figure 6A:
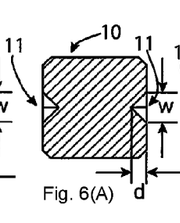
FIGS. 6(X), 6(Y), 6(A), 6(B), and 6(C) are views showing the board mounting terminal of a first modification of the present invention.
Figure 6B:
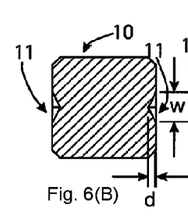
Figure 6C:
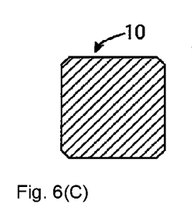
Figure 6X:
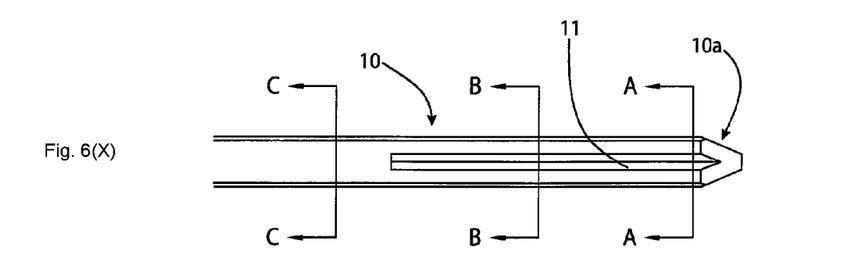
Figure 6Y:
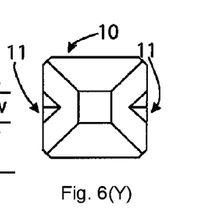
Figures 7A, 7B, 7C:
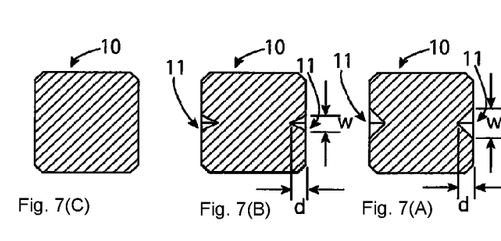
FIGS. 7(X), 7(Y), 7(A), 7(B), and 7(C) are views showing the board mounting terminal of a second modification of the present invention.
Figure 7X:
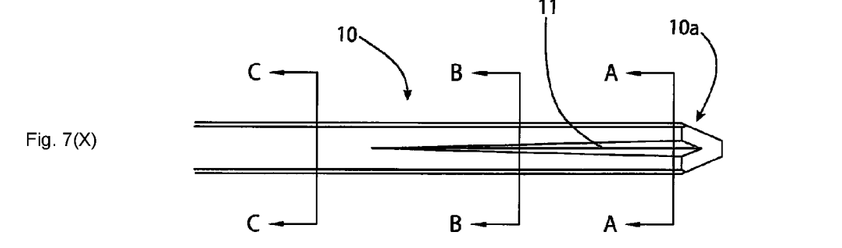
Figure 7Y:
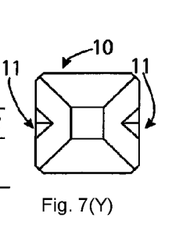
Figure 8A:
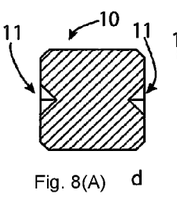
FIGS. 8(X), 8(Y), 8(A), 8(B), and 8(C) are views showing the board mounting terminal of a third modification of the present invention.
Figure 8B:
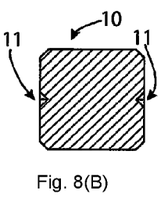
Figure 8C:
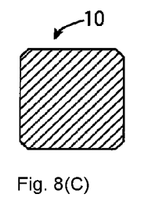
Figure 8X:
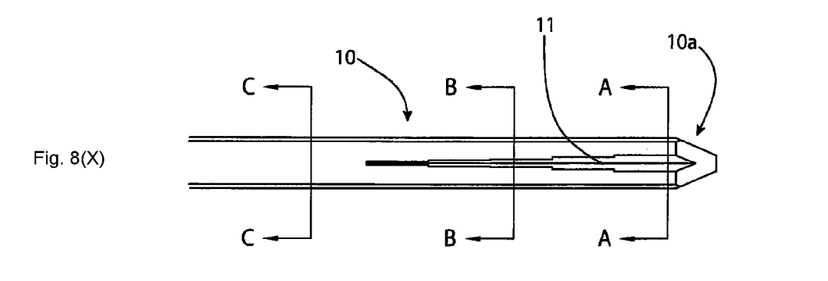
Figure 8Y:
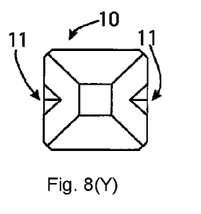

Solder paste 31 is pushed out from the through-hole 21 and adheres to the tip portion 10a of the board mounting terminal 10. In this state, the circuit board 20 is put into a reflow oven (not shown) and heated. The solder pastes 31, 32 melt and, with their viscosities lower, the solder paste 31, adhering to the tip portion 10a of the board mounting terminal 10 melts and flows up along the recessed groove 11 as a result of the capillary action. Then, the molten solder flowing up merges into the molten solder 32 remaining within the through-hole 21 to contribute to soldering of the board mounting terminal 10. As a result, an insufficiency of solder for soldering is reduced and reliable soldering can be achieved.

Hereinafter, various modifications of the board mounting terminal 10 will be described.

FIGS. 6(X), 6(Y), and 6(A) to 6(C) are views showing the board mounting terminal of a first modification. FIGS. 6(X), 6(Y), and 6(A) to 6(C) correspond to FIGS. 4(X), 4(Y), and 4(A) to 4(C), respectively.

The board mounting terminal 10 shown in FIGS. 6(X), 6(Y), 6(A), 6(B), and 6(C) has the recessed groove 11 different in shape from the recessed groove 11 of the board mounting terminal 10 described above. However, for the sake of clarity, in the various modifications shown in the drawings in and after FIGS. 6(X), 6(Y), 6(A), 6(B), and 6(C), the board mounting terminal also is denoted by the reference numeral "10", the tip portion of the board mounting terminal also is denoted by the reference numeral "10a", and the recessed groove also is denoted by the reference numeral "11".

The recessed groove 11 of the board mounting terminal 10 of the first modification shown in FIGS. 6(X), 6(Y), 6(A), 6(B), and 6(C) is a groove having a depth "d" of the recessed groove 11 appearing in the cross section (height of the triangle) decreasing continuously as the distance from the tip portion 10a of the board mounting terminal 10 increases. The width "w" of the recessed groove 11 of this modification (base of the triangle) is a constant width regardless of the distance from the tip portion 10a of the board mounting terminal 10.

The recessed groove 11 of this first modification has the area of the recess of the recessed groove 11 in the cross-section decreasing continuously as the distance from the tip portion 10a of the board mounting terminal 10 increases by decreasing the depth of the recessed groove 11.

FIGS. 7(X), 7(Y), 7(A), 7(B), and 7(C) are views showing the board mounting terminal 10 of a second modification. The recessed groove 11 of the board mounting terminal 10 of the second modification shown in FIGS. 7(X), 7(Y), 7(A), 7(B), and 7(C) is a groove having the width "w" of the recessed groove 11 appearing in the cross-section (base of the triangle) decreasing continuously as the distance from the tip portion 10a of the board mounting terminal 10 increases. The depth "d" of the recessed groove 11 of this second modification (height of the triangle) is a constant depth regardless of the distance from the tip portion 10a of the board mounting terminal 10. The recessed groove 11 of this second modification has the area of the recess of the recessed groove 11 in cross-section decreasing continuously as the distance from the tip portion 10a of the board mounting terminal 10 increases by decreasing the width of the recessed groove 11.

FIGS. 8(X), 8(Y), 8(A), 8(B), and 8(C) are views showing the board mounting terminal of a third modification. Both the first and second modifications described above have grooves decreasing the areas of the recesses of the recessed grooves in the cross-sections continuously as the distances from the tip portions 10a of the board mounting terminal 10 increase. In contrast, the board mounting terminal 10 of the third modification shown in FIGS. 8(X), 8(Y), 8(A), 8(B), and 8(C) is a groove having the area of a recess of the recessed groove in the cross-section decreasing stepwise in sequence as the distance from the tip portion 10a of the board mounting terminal increases. The capillary action is similarly sufficiently brought about for the recessed groove 11 narrowing stepwise in sequence.

Figure 9A:
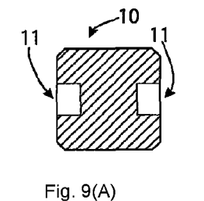
FIGS. 9(A) to 9(F) are views showing various cross-sectional shapes of the recessed grooves.
Figure 9B:
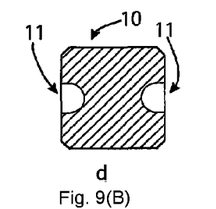
Figure 9C:
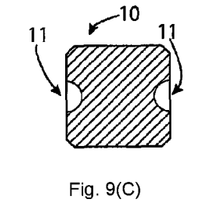

FIGS. 9(A) to 9(F) are views showing various cross-sectional shapes of the recessed groove. The embodiments and the various modifications described above have grooves that are triangular recesses in the cross-section. The recess can have other shapes in cross-section. For example, the shape of the recess in cross-section may be a rectangular shape, a U-like shape, or a semicircular shape as shown in FIGS. 9(A), 9(B), and 9(C). That is, the recessed groove 11 of the present invention can have various different shapes, so long as the cross-sectional shape of the recessed groove has the area of the recess in cross-section decreasing continuously or stepwise in sequence as the distance from the tip portion 10a of the board mounting terminal 10 increases.

Figure 9D:
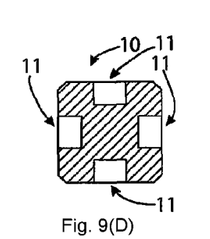
Figure 9E:
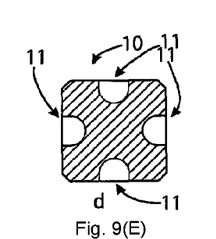
Figure 9F:
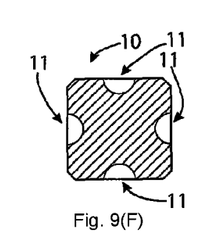

In addition, for the embodiments and various modifications described above, recessed grooves 11 can be formed on multiple faces of the board mounting terminal 10. As shown FIGS. 9(A) to 9(C), the recessed grooves 11 are formed in two opposite faces of the board mounting terminal 10. As shown in FIGS. 9(D) to 9(F), the recessed grooves 11 are formed in all four faces of the board mounting terminal 10. The board mounting board 10 of the present invention is not limited to one, two, or four faces.

Further, the board mounting terminals 10 of the embodiments and the various modifications described above have substantially rectangular cross-sectional shapes when the recessed grooves 11 are filled up. However, the cross-sectional shape of the board mounting terminal 10 is not required to be substantially rectangular but may take other forms such as circular. The cross-sectional shape of board mounting terminal 10 may take various other shapes so long as the cross-sectional shape of board mounting terminal has a shape extending like a rod.

Although several exemplary embodiments have been shown and described, it will be appreciated by those skilled in the art that various changes or modifications may be made in these embodiments without departing from the principles and spirit of the present invention, the scope of which is defined in the claims and their equivalents.

What is claimed is:

1. A board mounting terminal extending like a rod:
   (a) for being inserted into a through-hole in a circuit board and being soldered to the circuit board,
   (b) having a tip portion, and
   (c) having a recessed groove in a face of the board mounting terminal:
      (1) extending in a direction of extension of the board mounting terminal,
      (2) having a tip end in the tip portion of the board mounting terminal, and
      (3) having an area of a recess of the recessed groove in a cross-section extending in a direction transverse to the direction of extension of the board mounting terminal decreasing as a distance from the tip portion of the board mounting terminal, oriented in a direction of insertion of the board mounting terminal, increases.

2. The board mounting terminal according to claim 1, wherein the recessed groove has at least one of:
   (a) a width of the recessed groove, and
   (b) a depth of the recessed groove
   appearing in the cross-section decreasing continuously as the distance from the tip portion of the board mounting terminal increases.

3. The board mounting terminal according to claim 2, wherein:
   (a) the recess in the cross-section is triangular in shape, and
   (b) the recessed groove has both:
      (1) a length of a base of the triangle, and
      (2) a height of the triangle
      decreasing continuously as the distance from the tip portion of the board mounting terminal increases.

4. The board mounting terminal according to claim 1, wherein the area of the recess of the recessed groove decreases stepwise in cross-section in sequence as the distance from the tip portion board mounting terminal increases.

5. The board mounting terminal according to claim 1, wherein:
   (a) the board mounting terminal has a rectangular shape in the cross-section when the recessed groove is filled up,
   (b) the recessed groove is in a first face of the board mounting terminal, and
   (c) the board mounting terminal has a second recessed groove in a second face of the board mounting terminal opposite the first face of the board mounting terminal.

6. The board mounting terminal according to claim 1, wherein the recessed groove is longer than the thickness of the circuit board.

7. The board mounting terminal according to claim 1, wherein the recessed groove has a triangular shape.

8. The board mounting terminal according to claim 1, wherein the recessed groove has a rectangular shape.

9. The board mounting terminal according to claim 1, wherein the recessed groove has a U-like shape.

10. The board mounting terminal according to claim 1, wherein the recessed groove has a semicircular shape.

11. The board mounting terminal according to claim 1, wherein the board mounting terminal has a plurality of faces and selected faces of the board mounting terminal have the recessed grooves.

12. The board mounting terminal according to claim 1, wherein the board mounting terminal has a plurality of faces with each face of the board mounting terminal having the recessed groove.

13. The board mounting terminal according to claim 8, wherein the board mounting terminal has a plurality of faces and selected faces of the board mounting terminal have the recessed grooves.

14. The board mounting terminal according to claim 9, wherein the board mounting terminal has a plurality of faces and selected faces of the board mounting terminal have the recessed grooves.

15. The board mounting terminal according to claim 10, wherein the board mounting terminal has a plurality of faces and selected faces of the board mounting terminal have the recessed grooves.

* * * * *